(12) United States Patent
Zur et al.

(10) Patent No.: US 11,237,195 B2
(45) Date of Patent: Feb. 1, 2022

(54) FREQUENCY ESTIMATION

(71) Applicant: Intel Corporation, Santa Clara, CA (US)

(72) Inventors: Sarit Zur, Petah-Tikva (IL); Igal Kushnir, Hod-Hasharon (IL); Gil Horovitz, Emek-Hef (IL); Rotem Banin, Even-Yehuda (IL); Sergey Bershansky, Netanya (IL)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 16/500,172

(22) PCT Filed: Jun. 26, 2017

(86) PCT No.: PCT/US2017/039197
§ 371 (c)(1),
(2) Date: Oct. 2, 2019

(87) PCT Pub. No.: WO2019/004993
PCT Pub. Date: Jan. 3, 2019

(65) Prior Publication Data
US 2021/0116871 A1 Apr. 22, 2021

(51) Int. Cl.
*G01R 23/02* (2006.01)
*G04F 10/00* (2006.01)
*G04F 10/06* (2006.01)
*H03L 7/187* (2006.01)
*H03L 7/197* (2006.01)

(52) U.S. Cl.
CPC .......... *G01R 23/02* (2013.01); *G04F 10/005* (2013.01); *G04F 10/06* (2013.01); *H03L 7/187* (2013.01); *H03L 7/197* (2013.01)

(58) Field of Classification Search
CPC ....... G01R 23/02; G01R 23/10; G04F 10/005; G04F 10/06; H03L 7/06
See application file for complete search history.

(56) References Cited

U.S. PATENT DOCUMENTS

| 4,786,861 | A | 11/1988 | Hulsing, II et al. |
| 7,804,290 | B2* | 9/2010 | Henzler .................. G04F 10/00 |
| | | | 324/76.82 |
| 10,181,856 | B2* | 1/2019 | Banin ....................... H03L 7/08 |
| 10,454,483 | B2* | 10/2019 | Moore .................. G04F 10/005 |

(Continued)

OTHER PUBLICATIONS

D. Huang, W. Li, J. Zhou, N. Li, J. Ren and J. Chen, "A time-to-digital converter based AFC for wideband frequency synthesizer," 2012 IEEE International Symposium on Circuits and Systems (ISCAS), 2012, pp. 1299-1302 (Year: 2012).*

(Continued)

*Primary Examiner* — Patrick O Neill
(74) *Attorney, Agent, or Firm* — Schiff Hardin LLP

(57) ABSTRACT

A frequency estimator for estimating a frequency, including a counter configured to count an integer number of full clock cycles during a measurement time window; a Time-to-Digital Converter (TDC) configured to measure a fraction of a clock cycle during the measurement time window; and a processor configured to determine the estimated frequency based on the counted number of full clock cycles and the measured fraction of the clock cycle.

14 Claims, 2 Drawing Sheets

(56) References Cited

U.S. PATENT DOCUMENTS

2006/0017475 A1    1/2006   Kazuma
2007/0032213 A1    2/2007   Grieco et al.
2014/0210532 A1    7/2014   Jenkins

OTHER PUBLICATIONS

USPTO, PCT International Search Report issued for PCT/US2017/039197, 2 pgs., dated Sep. 6, 2017.

* cited by examiner

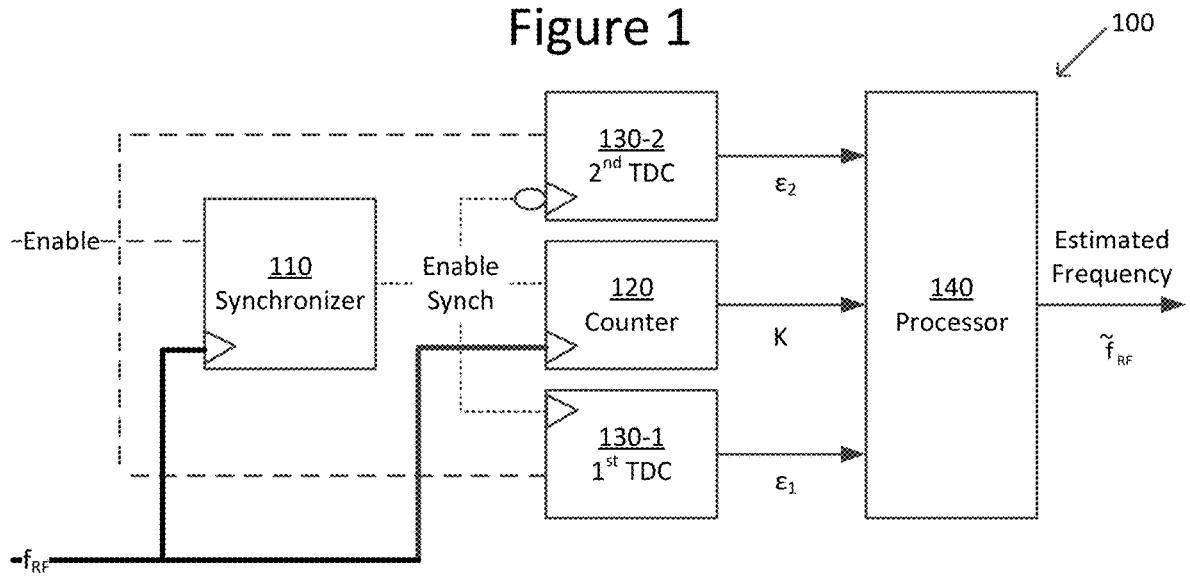
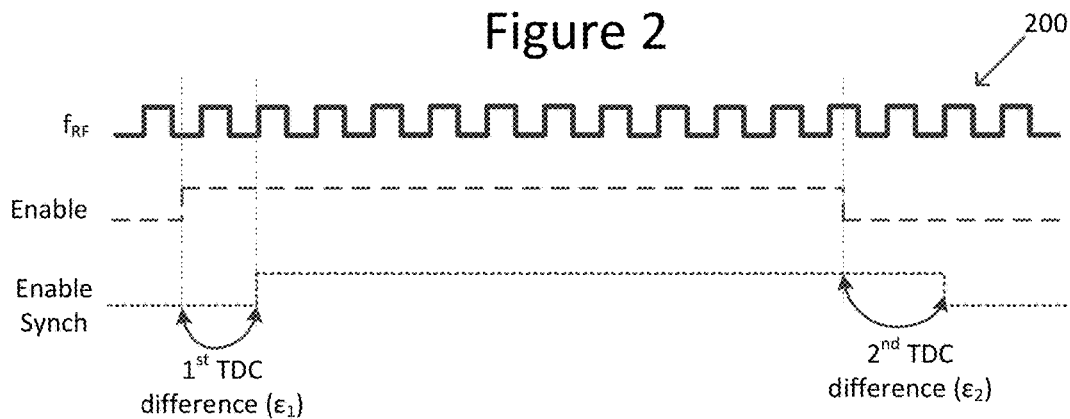
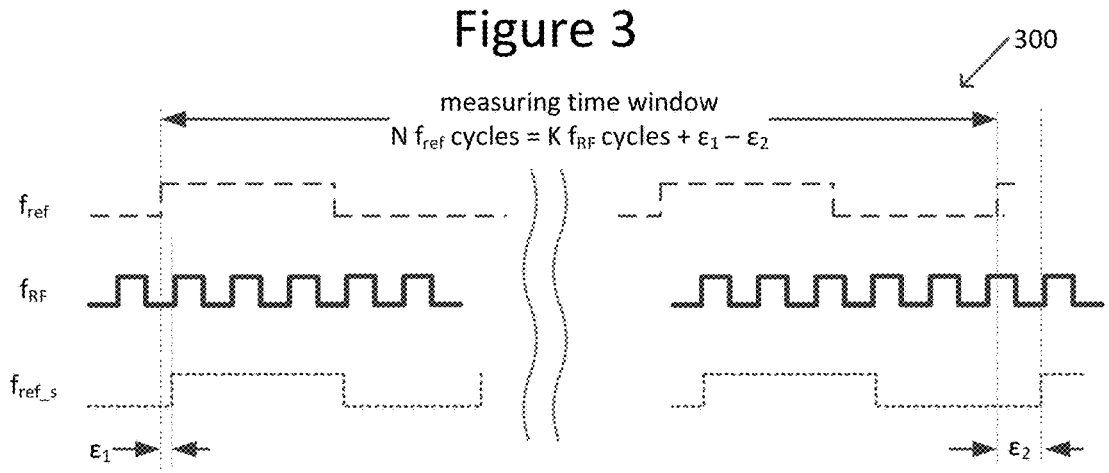

FREQUENCY ESTIMATION

BACKGROUND

Frequency estimation is conventionally based on a counter synchronized to a known reference frequency. The counter counts an integer number of cycles of an estimated frequency for a predetermined measurement time period. The accuracy of the counter is inversely proportional to the measurement time period, so there is a trade-off between the speed of the calibration and its accuracy.

BRIEF DESCRIPTION OF THE DRAWINGS

FIG. 1 illustrates a schematic diagram of a frequency estimator in accordance with an aspect of the disclosure.

FIG. 2 illustrates a signal timing diagram with respect to the frequency estimator of FIG. 1.

FIG. 3 illustrates another signal timing diagram with respect to the frequency estimator of FIG. 1.

DESCRIPTION OF THE ASPECTS

Figure 4A:
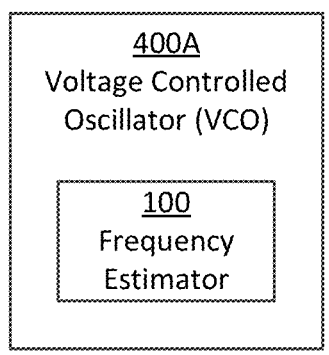
FIG. 4A illustrates a schematic diagram Voltage Controller Oscillator (VCO) comprising the frequency estimator 100 of FIG. 1.

The present disclosure is directed to a frequency estimator that is configured to both count an integer number of full cycles and measure a fraction of a cycle of an estimated frequency during a predetermined measurement time period to result in a faster and more accurate frequency estimation.

FIG. 1 illustrates a schematic diagram of a frequency estimator 100 in accordance with an aspect of the disclosure. To assist with the description of the frequency estimator 100, FIGS. 2 and 3 illustrate signal timing diagrams 200 and 300, respectively.

The frequency estimator 100 comprises a synchronizer 110, a counter 120, a first Time-to-Digital Converter (TDC) 130-1, a second TDC 130-2, and a processor 140.

As explained in detail below, the frequency estimator 100 determines the estimated frequency $\tilde{f}_{RF}$ in a measurement time window using the counter to count an integer number of cycles and the TDC 130 to measure a fraction of a cycle.

The synchronizer 110 is configured to generate an enable synchronization signal. The synchronizer 110 receives the enable signal derived from a reference clock and the frequency to be estimated $f_{RF}$ to generate the enable synchronization signal by shifting an edge timing of the enable signal to correlate with an edge timing of the frequency to be estimated $f_{RF}$. See FIGS. 2 and 3. The enable signal defines a measurement time window, and the enable synchronization signal is a synchronized version of the enable signal. The result is an enable signal that otherwise might have been triggered in the middle of a cycle being triggered at a beginning of a cycle. Any meta-stability that may occur will occur in the synchronizer 110 only.

The counter 120 is configured to count an integer number K of full clock cycles during the measurement time window. The counter 120 may be implemented using an arrangement of flip-flops or any other suitable circuit element(s).

The Time-to-Digital Converter (TDC) is configured to measure a fraction of a clock cycle during the measurement time window. The TDC comprises the first TDC 130-1 and the second TDC 130-2. The circle at the enable input of the second TDC 130-2 is a standard symbol indicating a falling edge triggered circuit, though the disclosure is not limited to this particular design.

Referring to FIGS. 2 and 3, the TDC 130 compares the time difference between the synchronizer input (enable signal) and output (synchronization enable signal). The first TDC 130-1 is configured to measure a first time difference $\varepsilon_1$ between the start of the enable signal and the start of the synchronization enable signal; in this case the "start" is a rising edge. The second TDC 130-2 is configured to measure a second time difference $\varepsilon_2$ between the end of the enable signal and the end of the synchronization enable signal; in this case the "end" is a falling edge. A difference between the second time difference $\varepsilon_2$ and the first time difference $\varepsilon_1$ represents the fraction of the clock cycle.

The dynamic range of the TDC 130 covers one cycle for the time difference between the enable signal and the enable synchronization signal, which includes any latency that is present in the synchronizer 110 plus metastability.

The processor 140 is configured to determine the estimated frequency $\tilde{f}_{RF}$ based on the counted number K of full clock cycles and the measured fraction of a clock cycle. More specifically, the estimated frequency $\tilde{f}_{RF}$, as determined by the processor 140, is represented by:

$$\tilde{f}_{RF} = \frac{(K+P) \cdot f_{ref}}{N}, \quad \text{(Equation 1)}$$

where K is the integer number of counted full clock cycles during the measurement time window, P is the measured fraction (P<1) of a clock cycle during the measurement time window, $f_{ref}$ is a reference frequency, and N is a number of full clock cycles of the reference clock during the measurement time window.

Represented another way, the estimated frequency $\tilde{f}_{RF}$ is as follows:

$$\tilde{f}_{RF} = \frac{K}{N/f_{ref} - \varepsilon_1 + \varepsilon_2}, \quad \text{(Equation 2)}$$

where K is the integer number of counted full clock cycles during the measurement time window, $f_{ref}$ is a reference frequency, and N is a number of full clock cycles of the reference clock during the measurement time window, $\varepsilon_1$ is the first time difference, and $\varepsilon_2$ is the second time difference.

The disclosed frequency estimation is advantageous over conventional frequency estimation as highlighted by a Wi-Fi Voltage Controlled Oscillator (VCO) band selection application requiring a frequency estimation error $f_{err}$ of less than 2 MHz. For a frequency $f_{RF}$ of 5 GHz measured with a crystal reference clock of 80 MHz, a difference between the conventional frequency estimation and the frequency estimation as disclosed herein is as follows.

For the conventional frequency estimation (i.e., integer estimation), the measurement time is $$\frac{40 \text{ cycles}}{80 \text{ MHz}} = 500 \text{ ns},$$

with a frequency estimation error of $$\frac{80 \text{ MHz}}{40 \text{ cycles}} = 2 \text{ MHz}.$$

For complete VCO band selection, there are 8 cycles, resulting in 500 nS×8=4 μs. For fast band switching, the settling time requirement is approximately 3 us including band selection.

For the frequency estimation as disclosed herein (i.e., integer plus rational estimation), with a TDC resolution of 1 ps, for a 20 times shorter measurement time, there is a measurement time of $$\frac{2 \text{ cycles}}{80 \text{ MHz}} = 25 \text{ ns,}$$

with a frequency estimation error of $$\frac{80 \text{ MHz}}{2 \text{ cycles}} \cdot 1 \text{ ps} \cdot 5 \text{ GHz} = 200 \text{ kHz}.$$

For the frequency estimation disclosed herein (i.e., integer plus rational estimation), with a TDC resolution of 1 pS, for the same measurement time as in the conventional frequency estimation time of $$\frac{40 \text{ cycles}}{80 \text{ MHz}},$$

there is a frequency error of $$\frac{80 \text{ MHz}}{40 \text{ cycles}} \cdot 1 \text{ ps} \cdot 5 \text{ GHz} = 10 \text{ kHz}.$$

The frequency estimation is quantized by the resolution of the TDC 130 plus the length of enable synchronization time. Without the TDC 130, the resolution would be equal to 1/(enable synchronization time). The added resolution of the TDC 130 improves the resolution to be (TDC_quantization [UI])/(enable synchronization time). For example, a 9-bit TDC improves the resolution by a factor of 512.

FIG. 4A illustrates a schematic diagram Voltage Controller Oscillator (VCO) 400A comprising the frequency estimator 100 of FIG. 1.

Figure 4B:
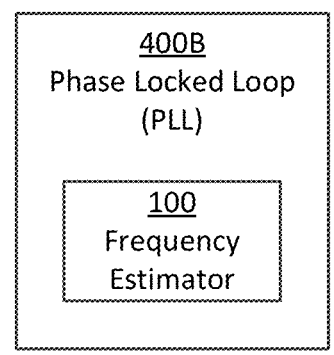
FIG. 4B illustrates a schematic diagram of a Phase Locked Loop (PLL) comprising the frequency estimator 100 of FIG. 1.

FIG. 4B illustrates a schematic diagram of a Phase Locked Loop (PLL) 400B comprising the frequency estimator 100 of FIG. 1.

Figure 5:
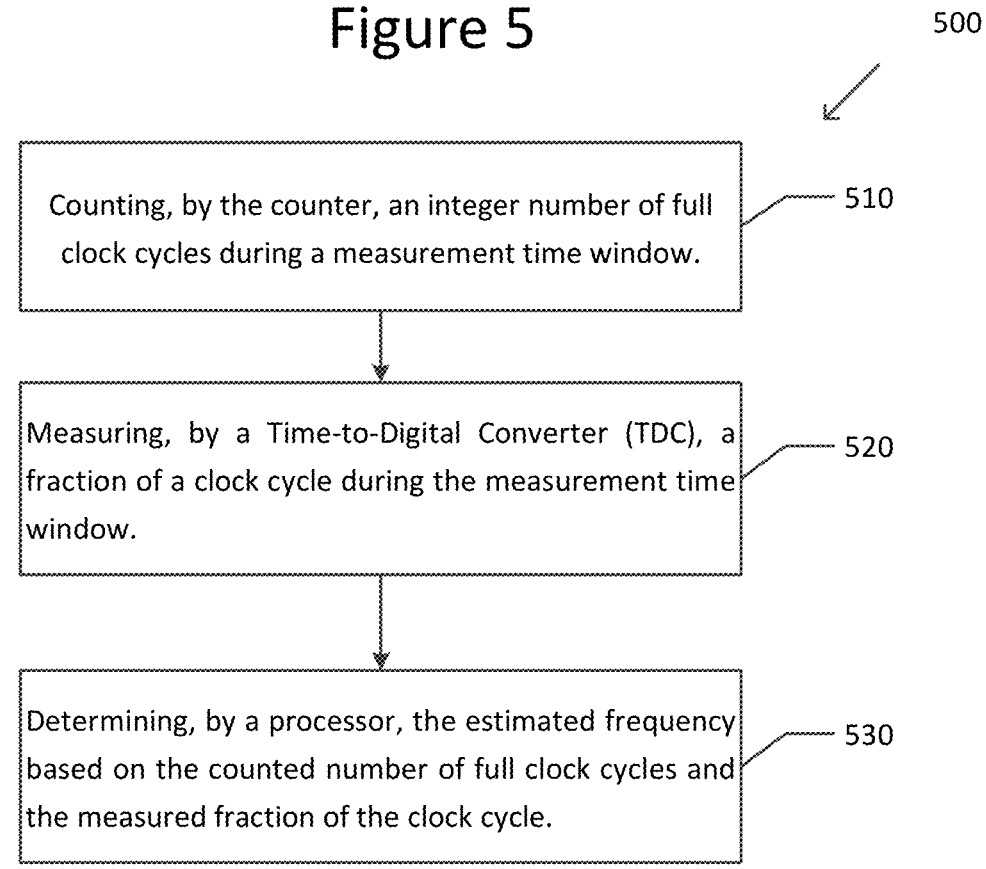
FIG. 5 illustrates a flowchart of a frequency estimation method in accordance with an aspect of the disclosure.

FIG. 5 illustrates a flowchart 500 of a frequency estimation method in accordance with an aspect of the disclosure.

At Step 510, the counter 120 counts an integer number of full clock cycles during the measurement time window.

At Step 520, the TDC 130 measures a fraction of a clock cycle during the measurement time window.

At Step 530, the processor 140 determines the estimated frequency $\tilde{f}_{RF}$ based on the counted number of full clock cycles and the measured fraction of the clock cycle.

The disclosure is advantageous in that it provides both fast and accurate frequency estimation, thus allowing for system performance improvement. For example, this disclosure solves fast VCO sub-band selection, allowing fast setting of the VCO when changing frequency from channel to channel, turning on, and switching from a single channel to channel bonding. Also, the disclosure allows fast sub-band selection in injection locking dividers and injection locking multipliers.

The following examples pertain to further embodiments.

Example 1 is a frequency estimator for estimating a frequency, comprising: a counter configured to count an integer number of full clock cycles during a measurement time window; a Time-to-Digital Converter (TDC) configured to measure a fraction of a clock cycle during the measurement time window; and a processor configured to determine the estimated frequency based on the counted number of full clock cycles and the measured fraction of the clock cycle.

In Example 2, the subject matter of Example 1, further comprising: a synchronizer configured to generate an enable synchronization signal by shifting an edge timing of an enable signal derived from a reference clock to correlate with an edge timing of the frequency to be estimated, wherein the enable synchronization signal defines the measurement time window.

In Example 3, the subject matter of Example 2, wherein the TDC is configured to measure a time difference between the synchronization signal and the enable synchronization signal.

In Example 4, the subject matter of Example 3, wherein the TDC comprises: a first TDC configured to measure a first time difference between a start of the enable signal and a start of the synchronization enable signal; and a second TDC configured to measure a second time difference between an end of the enable signal and an end of the synchronization enable signal, wherein a difference between the second time difference and the first time difference is the time difference between the synchronization signal and the enable synchronization signal.

In Example 5, the subject matter of Example 4, wherein the processor is configured to determine the estimated frequency to be the integer number of full clock cycles, plus the first time difference, minus the second time difference.

In Example 6, the subject matter of Example 4, wherein the processor is configured to determine the estimated frequency based on $$\tilde{f}_{RF} = \frac{K}{N/f_{ref} - \varepsilon_1 + \varepsilon_2},$$

where K is the integer number of counted full clock cycles during the measurement time window, $f_{ref}$ is a reference frequency of the reference clock, and N is a number of full clock cycles of the reference clock during the measurement time window, $\varepsilon_1$ is the first time difference, and $\varepsilon_2$ is the second time difference.

In Example 7, the subject matter of Example 1, wherein the processor is configured to determine the estimated frequency based on $$\tilde{f}_{RF} = \frac{(K+P) \cdot f_{ref}}{N},$$

where K is the integer number of counted full clock cycles during the measurement time window, P is the measured fraction of the clock cycle during the measurement time window, $f_{ref}$ is a reference frequency of a reference clock, and N is a number of full clock cycles of the reference clock during the measurement time window.

Example 8 is a Voltage Controlled Oscillator (VCO) comprising the frequency estimator of Example 11.

Example 9 is a Phase Locked Loop (PLL) comprising the frequency estimator of Example 1.

Example 10 is a method of estimating a frequency, comprising: counting, by a counter, an integer number of full clock cycles during a measurement time window; measuring, by a Time-to-Digital Converter (TDC), a fraction of a clock cycle during the measurement time window; and determining, by a processor, the estimated frequency based on the counted number of full clock cycles and the measured fraction of the clock cycle.

In Example 11, the subject matter of Example 10, further comprising: generating, by a synchronizer, an enable synchronization signal by shifting an edge timing of an enable signal derived from a reference clock to correlate with an edge timing of the frequency to be measured, wherein the enable synchronization signal defines the measurement time window.

In Example 12, the subject matter of Example 11, wherein the measuring of the fraction of the clock cycle comprises measuring a time difference between the synchronization signal and the enable synchronization signal.

In Example 13, the subject matter of Example 12, wherein the measuring of the fraction of the clock cycle comprises: measuring, by a first TDC, a first time difference between a start of the enable signal and a start of the synchronization enable signal; and measuring, by a second TDC, a second time difference between an end of the enable signal and an end of the synchronization enable signal, wherein a difference between the second time difference and the first time difference is the time difference between the synchronization signal and the enable synchronization signal.

In Example 14, the subject matter of Example 13, wherein the determining the estimated frequency is based on the integer number of full clock cycles, plus the first time difference, minus the second time difference.

In Example 15, the subject matter of Example 13, wherein the determining the estimated frequency is based on $$\tilde{f}_{RF} = \frac{K}{N/f_{ref} - \varepsilon_1 + \varepsilon_2},$$

where K is the integer number of counted full clock cycles during the measurement time window, $f_{ref}$ is a reference frequency of the reference clock, and N is a number of full clock cycles of the reference clock during the measurement time window, $\varepsilon_1$ is the first time difference, and $\varepsilon_2$ is the second time difference.

In Example 16, the subject matter of Example 10, wherein the determining the estimated frequency based on $$\tilde{f}_{RF} = \frac{(K + P) \cdot f_{ref}}{N},$$

where K is the integer number of counted full clock cycles during the measurement time window, P is the measured fraction of the clock cycle during the measurement time window, $f_{ref}$ is a reference frequency of a reference clock, and N is a number of full clock cycles of the reference clock during the measurement time window.

Example 17 is a frequency estimator for estimating a frequency, comprising: a counting means for counting an integer number of full clock cycles during a measurement time window; a Time-to-Digital Converting means (TDC) for measuring a fraction of a clock cycle during the measurement time window; and a processing means for determining the estimated frequency based on the counted number of full clock cycles and the measured fraction of the clock cycle.

In Example 18, the subject matter of Example 17, further comprising: a synchronizing means for generating an enable synchronization signal by shifting an edge timing of an enable signal derived from a reference clock to correlate with an edge timing of the frequency to be estimated, wherein the enable synchronization signal defines the measurement time window.

In Example 19, the subject matter of Example 18, wherein the TDC is for measuring a time difference between the synchronization signal and the enable synchronization signal.

In Example 20, the subject matter of Example 19, wherein the TDC comprises: a first TDC for measuring a first time difference between a start of the enable signal and a start of the synchronization enable signal; and a second TDC for measuring a second time difference between an end of the enable signal and an end of the synchronization enable signal, wherein a difference between the second time difference and the first time difference is the time difference between the synchronization signal and the enable synchronization signal.

In Example 21, the subject matter of Example 20, wherein the processing means is for determining the estimated frequency to be the integer number of full clock cycles, plus the first time difference, minus the second time difference.

In Example 22, the subject matter of Example 20, wherein the processing means is for determining the estimated frequency based on $$\tilde{f}_{RF} = \frac{K}{N/f_{ref} - \varepsilon_1 + \varepsilon_2},$$

where K is the integer number of counted full clock cycles during the measurement time window, $f_{ref}$ is a reference frequency of the reference clock, and N is a number of full clock cycles of the reference clock during the measurement time window, $\varepsilon_1$ is the first time difference, and $\varepsilon_2$ is the second time difference.

In Example 23, the subject matter of Example 17, wherein the processing means is for determining the estimated frequency based on $$\tilde{f}_{RF} = \frac{(K + P) \cdot f_{ref}}{N},$$

where K is the integer number of counted full clock cycles during the measurement time window, P is the measured fraction of the clock cycle during the measurement time window, $f_{ref}$ is a reference frequency of a reference clock, and N is a number of full clock cycles of the reference clock during the measurement time window.

Example 24 is a Voltage Controlled Oscillator (VCO) comprising the frequency estimator of any of Examples 17-23.

Example 25 is a Phase Locked Loop (PLL) comprising the frequency estimator of any of Examples 17-23.

For the purposes of this discussion, the term "processor" shall be understood to be circuit(s), processor circuitry, logic, or a combination thereof. A circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A frequency estimator for estimating a frequency of a signal, comprising:
   a counter configured to count an integer number of full clock cycles of the signal during a measurement time window;
   a Time-to-Digital Converter (TDC) configured to measure a fraction of a clock cycle of the signal during the measurement time window;
   a synchronizer configured to generate an enable synchronization signal by shifting an edge timing of an enable signal derived from a reference clock to correlate with an edge timing of the frequency to be estimated, wherein the enable synchronization signal defines the measurement time window; and
   a processor configured to determine the estimated frequency of the signal based on the counted number of full clock cycles and the measured fraction of the clock cycle.

2. The frequency estimator of claim 1, wherein the TDC is configured to measure a time difference between the enable signal and the enable synchronization signal.

3. The frequency estimator of claim 2, wherein the TDC comprises:
   a first TDC configured to measure a first time difference between a start of the enable signal and a start of the enable synchronization signal; and
   a second TDC configured to measure a second time difference between an end of the enable signal and an end of the enable synchronization signal,
   wherein a difference between the second time difference and the first time difference is the time difference between the enable signal and the enable synchronization signal.

4. The frequency estimator of claim 3, wherein the processor is configured to determine the estimated frequency to be the integer number of full clock cycles, plus the first time difference, minus the second time difference.

5. The frequency estimator of claim 3, wherein the processor is configured to determine the estimated frequency based on $$\tilde{f}_{RF} = \frac{K}{N/f_{ref} - \varepsilon_1 + \varepsilon_2},$$

where K is the integer number of counted full clock cycles during the measurement time window, $f_{ref}$ is a reference frequency of the reference clock, and N is a number of full clock cycles of the reference clock during the measurement time window, $\varepsilon_1$ is the first time difference, and $\varepsilon_2$ is the second time difference.

6. The frequency estimator of claim 1, wherein the processor is configured to determine the estimated frequency based on $$\tilde{f}_{RF} = \frac{(K+P) \cdot f_{ref}}{N},$$

where K is the integer number of counted full clock cycles during the measurement time window, P is the measured fraction of the clock cycle during the measurement time window, $f_{ref}$ is a reference frequency of the reference clock, and N is a number of full clock cycles of the reference clock during the measurement time window.

7. A Voltage Controlled Oscillator (VCO) comprising the frequency estimator of claim 1.

8. A Phase Locked Loop (PLL) comprising the frequency estimator of claim 1.

9. A method of estimating a frequency of a signal, comprising:
   counting, by a counter, an integer number of full clock cycles of the signal during a measurement time window;
   measuring, by a Time-to-Digital Converter (TDC), a fraction of a clock cycle during the measurement time window;
   generating, by a synchronizer, an enable synchronization signal by shifting an edge timing of an enable signal derived from a reference clock to correlate with an edge timing of the frequency to be measure, wherein the enable synchronization signal defines the measurement time window; and determining, by a processor, the estimated frequency of the signal based on the counted number of full clock cycles and the measured fraction of the clock cycle.

10. The method of claim 9, wherein the measuring of the fraction of the clock cycle comprises measuring a time difference between the enable signal and the enable synchronization signal.

11. The method of claim 10, wherein the measuring of the fraction of the clock cycle comprises:
   measuring, by a first TDC, a first time difference between a start of the enable signal and a start of the enable synchronization signal; and
   measuring, by a second TDC, a second time difference between an end of the enable signal and an end of the enable synchronization signal,
   wherein a difference between the second time difference and the first time difference is the time difference between the enable signal and the enable synchronization signal.

12. The method of claim 11, wherein the determining the estimated frequency is based on the integer number of full clock cycles, plus the first time difference, minus the second time difference.

13. The method of claim 11, wherein the determining the estimated frequency is based on $$\tilde{f}_{RF} = \frac{K}{N/f_{ref} - \varepsilon_1 + \varepsilon_2},$$

where K is the integer number of counted full clock cycles during the measurement time window, $f_{ref}$ is a reference frequency of the reference clock, and N is a number of full clock cycles of the reference clock during the measurement time window, $\varepsilon_1$ is the first time difference, and $\varepsilon_2$ is the second time difference.

14. The method of claim 9, wherein the determining the estimated frequency based on $$\tilde{f}_{RF} = \frac{(K+P) \cdot f_{ref}}{N},$$

where K is the integer number of counted full clock cycles during the measurement time window, P is the measured fraction of the clock cycle during the measurement time window, $f_{ref}$ is a reference frequency of the reference clock, and N is a number of full clock cycles of the reference clock during the measurement time window.

* * * * *